(12) United States Patent
Cimino et al.

(10) Patent No.: US 11,791,172 B2
(45) Date of Patent: Oct. 17, 2023

(54) METHODS OF CONTROLLING GAS PRESSURE IN GAS-PULSING-BASED PRECURSOR DISTRIBUTION SYSTEMS

(71) Applicant: Applied Materials, Inc., Santa Clara, CA (US)

(72) Inventors: Mauro Cimino, San Jose, CA (US); Arkaprava Dan, San Jose, CA (US); Paul Z. Wirth, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 485 days.

(21) Appl. No.: 16/905,862

(22) Filed: Jun. 18, 2020

(65) Prior Publication Data
US 2021/0398823 A1 Dec. 23, 2021

(51) Int. Cl.
*C23C 16/455* (2006.01)
*H01L 21/67* (2006.01)
*C23C 16/52* (2006.01)

(52) U.S. Cl.
CPC .. *H01L 21/67017* (2013.01); *C23C 16/45561* (2013.01); *C23C 16/52* (2013.01); *H01L 21/67253* (2013.01)

(58) Field of Classification Search
CPC .................................................. C23C 16/45561
See application file for complete search history.

(56) References Cited

U.S. PATENT DOCUMENTS

| 6,701,066 | B2 | 3/2004 | Sandhu |
| 7,381,644 | B1 | 6/2008 | Subramonium et al. |
| 9,238,865 | B2 | 1/2016 | Pomarede et al. |
| 2007/0042508 | A1 | 2/2007 | Shajii et al. |
| 2012/0073672 | A1* | 3/2012 | Ding ................. C23C 16/45523 156/345.33 |
| 2017/0145564 | A1 | 5/2017 | Bertuch et al. |
| 2018/0023195 | A1 | 1/2018 | Muneshwar et al. |

* cited by examiner

*Primary Examiner* — Jae Lee
(74) *Attorney, Agent, or Firm* — Servilla Whitney LLC (57) ABSTRACT

Gas distribution apparatus to provide uniform flows of gases from a single source to multiple processing chambers are described. A valve upstream of a shared volume is controlled by at least two pressurizing sequences during a process it the processing chamber. The first pressurizing sequence opens and closes the upstream valve a first number of cycles and the second pressurizing sequence opens and closes the upstream valve less frequently after the first number of cycles. The open/close timing of the second pressurizing sequence occurs less frequently than the open/close timing of the first pressurizing sequence.

12 Claims, 4 Drawing Sheets

METHODS OF CONTROLLING GAS PRESSURE IN GAS-PULSING-BASED PRECURSOR DISTRIBUTION SYSTEMS

TECHNICAL FIELD

Embodiments of the disclosure generally relate to gas distribution apparatus. More particularly, embodiments of the disclosure relate to apparatus to distribute gas to multiple processing chambers using pulsing gas flows.

BACKGROUND

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

During processing, expensive precursor gases are frequently wasted by being diverted to the foreline when not in use. Additionally, delivery hardware for providing precursor flows is expensive and often requires a dedicated gas stick for delivering a precursor to each and every wafer processing station.

Temperature and pressure control in semiconductor manufacturing is extremely important to achieve expected process results. A multi-station, multi-chamber processing platform can be utilized to improve processing throughput and to perform multiple types of processes on a substrate in a sequential fashion. To ensure high efficiency of the overall system and quality of the processing results, the speed and precision of the control strategy adopted for each sub process within the manufacturing chain is important.

One of the most critical components in semiconductor chamber platforms is the gas delivery system. In some gas delivery systems, the accuracy and repeatability of precursor delivery to multi-stations or multi-chamber systems is less than ideal resulting in wasting of precursors.

Accordingly, there is a need in the art for apparatus and methods to uniformly and relatively inexpensively deliver gases to multiple processing chamber or process regions.

SUMMARY

One or more embodiments of the disclosure are directed to methods of providing a flow of gas to a processing chamber. A first pressurizing sequence is performed a first number of cycles. The first pressurizing sequence comprises opening and closing a valve upstream of a reservoir and opening and closing one or more valves downstream of the reservoir to pressurize the reservoir to a predetermined value. A second pressurizing sequence is performed after the first number of cycles until a process in the processing chamber is completed. The second pressurizing sequence comprises minimizing cycling of the upstream valve to maintain a pressure in the reservoir using parameters determined during the first pressurizing sequence.

Additional embodiments of the disclosure are directed to gas distribution apparatus comprising a shared volume, a pressure gauge, a pressure controller, flow controllers and a system controller. The shared volume has an upstream end and a plurality of downstream ends and a gas reservoir. The pressure gauge is connected to the shared volume. The pressure controller is connected to the upstream end of the shared volume. The pressure controller has an upstream valve. A flow controller is at each of the downstream ends of the shared volume. Each flow controller comprises an orifice and a downstream valve. The system controller is connected to the pressure gauge, the pressure controller and the flow controller. The system controller has one or more configurations comprising a first pressurizing configuration and a second pressurizing configuration having different process parameters than the first pressurizing configuration. The second pressurizing configuration minimizes cycling of the upstream valve.

Further embodiments of the disclosure are directed to non-transitory computer readable medium including instructions, that, when executed by a controller of a processing chamber, cause the processing chamber to perform operations of: performing a first pressurizing sequence a first number of cycles, the first pressurizing sequence comprising opening and closing a valve upstream of a reservoir and opening and closing one or more valves downstream of the reservoir to pressurize the reservoir to a predetermined value; and performing a second pressurizing sequence after the first number of cycles until a process in the processing chamber is completed, the second pressurizing sequence comprising minimizing cycling of the upstream valve to maintain a pressure in the reservoir using parameters determined during the first pressurizing sequence.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide a substrate processing system for continuous substrate deposition to maximize throughput and improve processing efficiency. One or more embodiments of the disclosure are described with respect to a spatial atomic layer deposition chamber.

Embodiments of the disclosure provide a new way of distributing precursors to multiple stations within a wafer processing chamber, and to multiple chambers within a cluster tool for atomic layer deposition (ALD) applications. A shared volume is advantageously used for a single precursor distribution to a whole cluster tool or multiple gas outlets of a batch processing chamber. Some embodiments advantageously provide gas pulsing technology to ensure accurate and repeatable/reproducible precursor delivery to all the stations of all the chambers within a cluster tool without any waste of expensive precursors.

Some embodiments of the disclosure advantageously provide apparatus and methods to minimize wasting of expensive precursors due to diverting precursor to foreline when not in use. Some embodiments advantageously provide apparatus and methods that minimize high precursor-delivery hardware costs due to using a dedicated gas stick for delivering a precursor to each and every wafer processing station of an ALD chamber.

Figure 1:
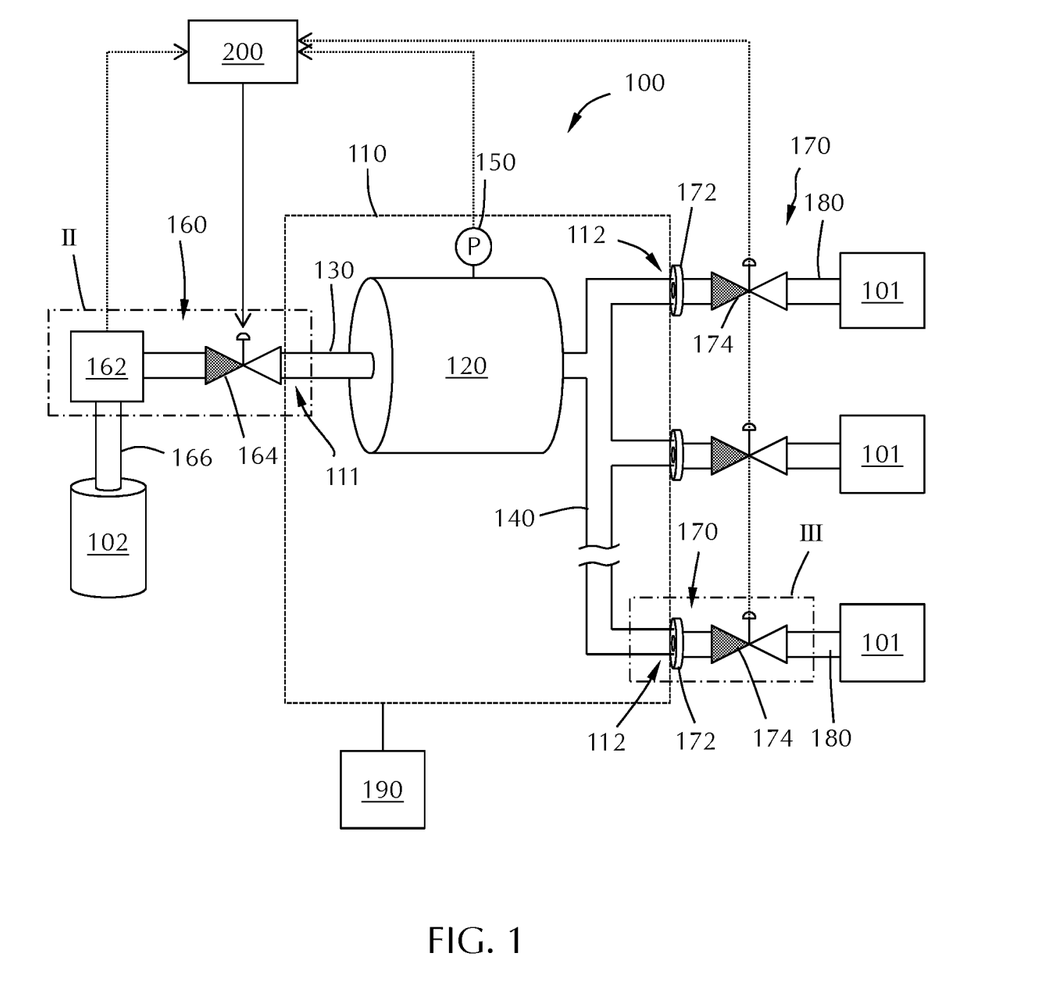
FIG. 1 shows a schematic representation of a gas distribution apparatus in accordance with one or more embodiments of the disclosure.

FIG. 1 shows an exemplary embodiment of the disclosure. A gas distribution apparatus 100 comprising a shared volume 110 to distribute gases to multiple processing stations 101. The use of the term "processing stations" refers to any chamber or process region of a chamber. For example, the processing stations 101 can be separate processing chambers or can be separate process regions of a single batch processing chamber. While FIG. 1 is illustrated with three processing stations 101, the skilled artisan will recognize that more or less than three processing stations 101 can be connected to the apparatus gas distribution apparatus 100.

The shared volume 110 has an upstream end 111 and a plurality of downstream ends 112. The shared volume 110 of some embodiments, as shown in the Figures, includes one or more of a gas reservoir 120 or distribution lines. In some embodiments, the shared volume 110 includes an upstream distribution line 130 from the upstream end 111 of the shared volume 110 to the gas reservoir 120. In some embodiments, the shared volume 110 includes a downstream distribution line 140 from the gas reservoir 120 to the plurality of downstream ends 112.

A pressure gauge 150 can be connected to the shared volume 110 to measure the pressure between the upstream end 111 and the plurality of downstream ends 112. The pressure gauge 150 can be positioned at any point between the upstream end 111 and the downstream ends 112. In some embodiments, the pressure gauge 150 is configured to measure the pressure in the gas reservoir. In some embodiments, there is more than one pressure gauge configured to measure pressure at different points of the shared volume 110.

A pressure controller 160 is connected to the upstream end 111 of the shared volume 110. As used in this manner, when a gas flow component is connected to another gas flow component, there is fluid communication between the components so that there is substantially no interference with the gas flow. As shown in the expanded view of region II in FIG. 2, the pressure controller of some embodiments comprises one or more of a regulator 162 or a mass flow controller. The regulator 162 or mass flow controller can be any suitable gas regulator or mass flow controller known to the skilled artisan. The regulator provides a supply pressure (or input pressure) to the shared volume 110. The regulator 162 can be any mechanical or electrically controlled proportional pressure control component.

Figure 2:
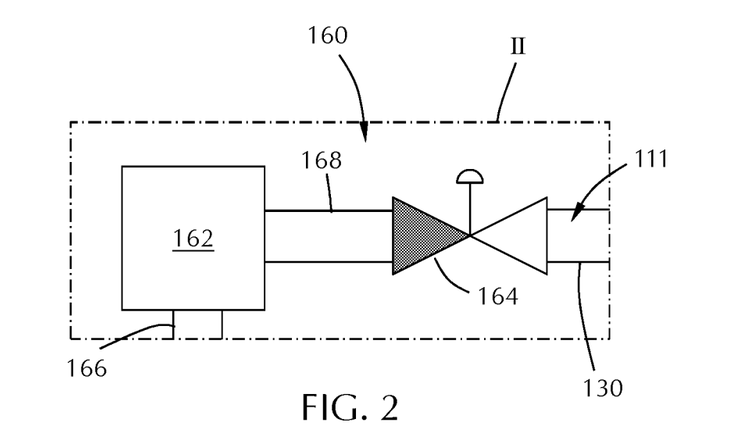
FIG. 2 shows an expanded view of region II of FIG. 1.

In some embodiments, the pressure controller 160 includes a fast pulsing valve 164. The fast pulsing valve 164 can be positioned between the regulator 162 and the upstream end 111 of the shared volume 110. In some embodiments, the fast pulsing valve 164 is upstream of the regulator 162. The fast pulsing valve 164 can be any valve that can open and/or close within 50 milliseconds. In some embodiments, the fast pulsing valve 164 can open and/or close within 40 milliseconds, 30 milliseconds, 20 milliseconds or 10 milliseconds. In some embodiments, the fast pulsing valve 164 can open and close within 50, 40, 30, 20 or 10 milliseconds. In some embodiments, the fast pulsing valve 164 is a valve that is either fully open or fully closed. In some embodiments, the fast pulsing valve 164 is a variable open valve that can allow modulation of the flow profile through the valve.

In FIG. 1, a gas source 102 is connected to the regulator 162 through inlet line 166. The regulator 162 is spaced from the fast pulsing valve 164 by pressure controller conduit 168. The length and/or volume of the pressure control conduit 168 can be any suitable length and/or volume, respectively. In some embodiments, the length and/or volume of the pressure control conduit 168 is minimized so that the fast pulsing valve 164 is in contact with the regulator 162.

Figure 3:
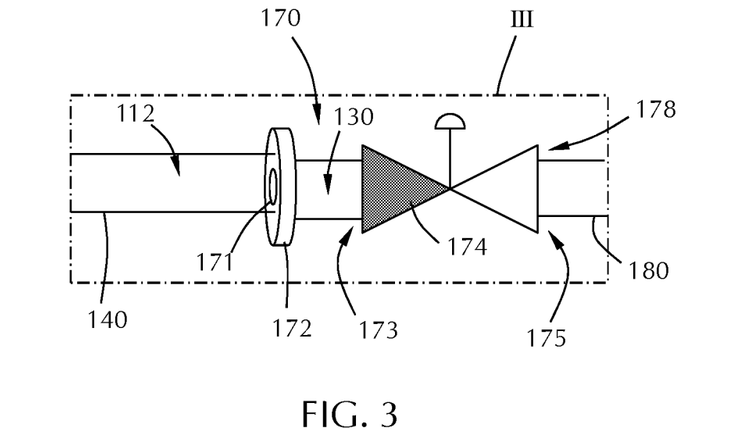
FIG. 3 shows an expanded view of region III of FIG. 1.

Referring to FIG. 1 and FIG. 3, the gas distribution apparatus 100 includes a flow controller 170 at each of the downstream ends 112 of the shared volume 110. FIG. 3 shows an expanded view of region III of FIG. 1. Each flow controller 170 includes an orifice 172 and a fast pulsing valve 174. The orifice 172 can be upstream of the fast pulsing valve 174, as shown in the Figures. In some embodiments, the orifice 172 is downstream of the fast pulsing valve 174.

The orifice 172 is in fluid communication with the fast pulsing valve 174 through flow control conduit 176. The volume of the flow control conduit 176 can be any suitable volume. In some embodiments, the volume between the orifice 172 and the fast pulsing valve 174 is minimized so that the orifice 172 and fast pulsing valve 174 are in contact. In some embodiments, the orifice 172 is at or within the inlet end 173 of the fast pulsing valve 174. In some embodiments, the orifice 172 is at or within the outlet end 175 of the fast pulsing valve 174.

The orifice 172 of some embodiments is a disk-shaped component with a precise aperture 171 extending therethrough. The orifice 172 acts as a restrictor in the flow path. In some embodiments, the gas distribution apparatus 100 includes a downstream gas conduit 180 connected to and in fluid communication with the downstream end 178 of each flow controller 170. The flow rate of gas exiting any of the flow controllers into the downstream gas conduit 180 is a function of the difference in pressure downstream of the orifice in the downstream gas conduit from the pressure upstream of the orifice.

In some embodiments, the pressure upstream of the orifices 172 in each of the flow controllers 170 is substantially the same. As used in this manner, the term "substantially the same" means that the pressure immediately before the orifices 172 are within 5%, 4%, 3%, 2% or 1% relative to the average pressure at all orifices 172.

The shared volume 110 of some embodiments is sufficiently large so that pressure perturbations in each downstream gas conduit 180 is less than ±5%, ±4%, ±3%, ±2% or ±1% relative to the average pressure.

Some embodiments of the disclosure are directed to methods of calibrating a flow control 170 comprising a fast pulsing valve 174 and an orifice 172. The pressure controller 160 is opened at the upstream end 111 of the shared volume 110 to pressurize the shared volume 110. Opening the pressure controller 160 can include openings the regulator and/or openings the fast pulsing valve 164. During pressurization, each of the flow controllers 170 is closed. After pressurizing the shared volume 110, the pressure controller 160 is closed to isolate the shared volume.

The pressure of the shared volume 110 can be monitored with the pressure controller 160 and flow controller 170 closed while the shared volume 110 is pressurized. A drift in the pressure measured using the pressure gauge 150 can indicate a leak in the system.

The pressure in the shared volume 110 is measured as an initial pressure. One of the fast pulsing valves 174 of one of the flow controllers 170 is opened and closed a predetermined number of times and the final pressure of the shared volume is measured. The difference in the final pressure relative to the initial pressure divided by the number of times that the valve was pulsed gives a pressure loss per pulse of that fast pulsing valve 174.

This process can be repeated for each of the flow controllers 170 to calibrate the pressure drop per pulse of each fast pulsing valve 174. The pulse window for one or more of the fast pulsing valves 174 can be altered to compensate for differences in the individual orifices 172 and fast pulsing valves 174.

Figure 4:
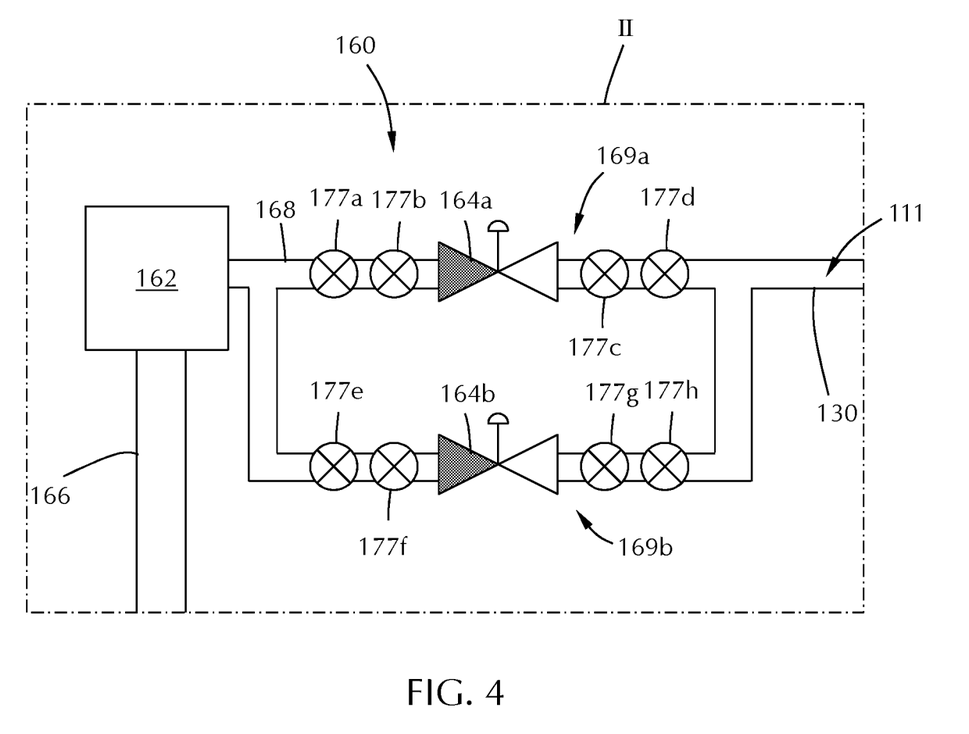
FIG. 4 shows an expanded view of region II of FIG. 1 according to one or more embodiment of the disclosure.

FIG. 4 illustrates another pressure controller 160 connected to the upstream end 111 of the shared volume 110. The illustration shows expanded view of region II of FIG. 1 according to another embodiment of the disclosure. In this embodiment, after the regulator 162 or mass flow controller, there are two flow paths 169*a*, 169*b* for the pressure control conduit 168. Each of the flow paths 169*a*, 169*b* has a fast pulsing valve 164*a*, 164*b*, respectively. The separate flow paths 169*a*, 169*b* can be isolated from each other by valves 177*a-d*, 177*e-h*, respectively to allow for the replacement of the fast pulsing valve 164*a*, 164*b* of one of the flow paths 169*a*, 169*b* without stopping any process being used. As will be understood by the skilled artisan, the dual valves on either side of the fast pulsing valves can be used to isolate the flow to one of the flow paths.

The gas distribution apparatus 100 of some embodiments further comprises a system controller 190. The system controller 190 may be coupled to various components of the gas distribution apparatus 100 to control the operation thereof. The system controller 190 can be a single controller that controls the apparatus, or multiple controllers that control individual portions of the apparatus. For example, the gas distribution apparatus 100 may include separate controllers for each of the pressure controller 160 and flow controller 170.

In some embodiments, the system controller 190 includes a central processing unit, a memory, and support circuits. The system controller 190 may control the gas distribution apparatus 100 directly, or via computers (or controllers) associated with particular process chamber and/or support system components. The system controller 190 may be one of any form of general-purpose computer processor that can be used in an industrial setting for controlling various chambers and sub-processors. The memory or computer readable medium of the controller may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU 196 for supporting the processor in a conventional manner. These circuits include cache, power supplies, clock circuits, input/output circuitry and subsystems, and the like. One or more processes may be stored in the memory as software routine that may be executed or invoked to control the operation of the apparatus or individual components in the manner described herein. The system controller 190 can include one or more configurations which can include any commands or functions to control flow rates, gas valves, gas sources or other processes for performing the various configurations.

The system controller 190 of some embodiments is connected to one or more of the pressure controller 160, the flow controller 170, the pressure gauge 150, the regulator 162, fast pulsing valve 164 or fast pulsing valve 174. The system controller 190 can have one or more configurations. In some embodiments, the system controller 190 has a configuration to open and/or close one or more of the fast pulsing valves 164, 174. In some embodiments, the system controller 190 has a configuration to monitor pressure using the pressure gauge 150. In some embodiments, the system controller 190 has a configuration to control regulator 162. In some embodiments, the system controller 190 has a configuration to calibrate the flow controllers 170.

Some embodiments of the disclosure are directed to processing platforms. For example, the embodiment illustrated in FIG. 1 can be considered a processing platform with three process chambers (processing stations 101). Each process station 101 is connected to one flow controller 170 at the downstream end of the shared volume 110 through a downstream gas conduit 180.

In some embodiments, as shown in FIG. 1, fast pulsing valves are used upstream and downstream of the reservoir. The multiple downstream valves 174 of some embodiments polls to feed the precursor to a multi-station chamber 101, and a single upstream valve 164 is utilized to refill the reservoir 120 and maintain the reservoir pressure at a predetermined level. A pressure controller is utilized to monitor the reservoir pressure in real-time extra term in the pulsing-time of the upstream valve 164, as well as the duration of each of the pulses. The pressure controller of some embodiments collects and uses real-time information from multiple pressure gauges 150, the downstream valves 174 and the upstream valve 164 to improve control of the reservoir pressure at a predetermined value.

Some embodiments of the disclosure provide methods to efficiently and/or precisely control pressure within the reservoir 120. In some embodiments, a control strategy is used for one or more of pressure control or temperature control of one or more devices. In some embodiments, the control strategy is used to control one or more devices selected from, but not limited to, temperature control devices, wafer processing chamber components, temperature controlled substrate supports, chamber lids, showerhead heaters, slit-valve heaters and/or gas-line heaters.

Some embodiments of the disclosure advantageously allow for the achievement of performance otherwise unattainable with conventional control strategies. In some embodiments the gas-pulsing-based precursor delivery system illustrated in FIG. 1 incorporates one or more methods in a system controller to improve valve longevity. In some embodiments, a system controller connected to a gas-pulsing-based precursor delivery system, for example, the embodiment illustrated in FIG. 1, includes one or more configurations or processes to improve valve longevity, reliability and/or repeatability. Some embodiments of the disclosure advantageously provide fast and precise control of reservoir pressure.

Figure 5:
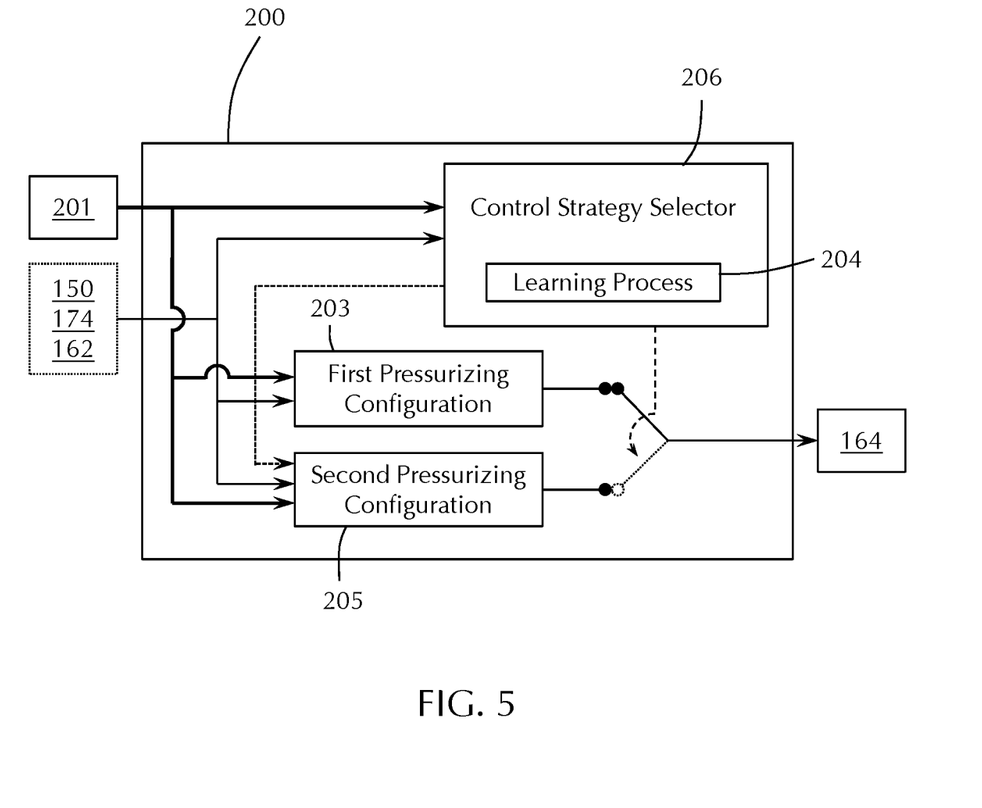
FIG. 5 shows a control method according to one or more embodiment of the disclosure.

FIG. 5 illustrates an embodiment of a method 200 or control strategy for regulating the reservoir 120 pressure. In some embodiments, the method 200 (or control strategy)

manipulates the upstream pulsing valve 164 based on feedback from one or more of pressure readings from the pressure gauge 150, the status of the downstream pulsing valves 174 or the pressure of the upstream regulator 162. The method 200 is illustrated in FIG. 1 with connections (arrowed lines) to some components as described below.

The signal 201 represents the target pressure. Any of the selected control strategies embedded in the pressurizing configurations 203 and 205 is designed to react to deviations of the pressure feedback 150 from the target 201 by extending or reducing the pulsing time of the source valve 164. Since the key contributors to the deviation of the pressure 150 include changes in the upstream regulator pressure 162 and the position of the downstream valves 174, the feedback from 162 and 174 can also be utilized in any of the pressurizing configurations to provide an early notification of expected future changes of pressure 150.

With early notification, the control strategies in the pressurizing configurations 203 and 205 of some embodiments provide the necessary correction to avoid or minimize the pressure changes resulting from variations of the regulator pressure 162 and the position of the downstream valves 174.

In some embodiments, the same signals 201, 150, 174 and 162 are provided also to the control strategy selector 206. The purpose of the control strategy selector 206 is not to compensate for variations of the pressure 150, but to supervise the overall pressure control and to switch among the different pressurizing configurations. In some embodiments, the signals 201, 150, 174 and 162 are utilized by the control strategy selector 206 to monitor and learn how the pressure 150 varies in correspondence to changes of the key contributors.

In some embodiments, the result of the learning is utilized to determine the timing of the switch and how to initialize the second pressurizing configuration before its use. The initialization process is depicted in FIG. 5 by the signal 207, generated and sent by the learning process 204 to the pressurizing configuration 205.

In some embodiments, the method 200 (or control strategy) regulates the reservoir 120 pressure to maintain a predetermined value. In some embodiments, the fast pulsing valve 164 is configured to open and/or close within 10 milliseconds. In some embodiments, the pulsing valve 164 can open and close within 20, 30, 40 or 50 milliseconds. Due to the required pulsing high speed and frequency, the simplest and cost-effective choice for the control valve 164 is an on-off valve. On-off valves, also referred to as "bang-bang valves," as these valves shift between two discrete positions, open or closed. The bang-bang valves can be considered to operate in a binary manner; either open (on) or closed (off). When the valve 164 is open, mass flow enters the reservoir, contributing to an increase in pressure. When the valve 164 is closed, the mass flow into the reservoir is interrupted, and the pressure inside the reservoir is held constant. In contrast, when any of the downstream pulsing valves 174 are open, mass flow exiting the reservoir 120 causes a pressure drop. Therefore, to maintain the reservoir pressure around a predetermined value, the upstream valve 164 must be operated in a manner that depends on the mechanical design of the precursor delivery system, and on the pulsing scheme of the downstream valves 174.

Due to the on-off nature of the valve 164, classical control methodologies based on the joint use of a generic linear control system and a pulse-width modulation (PWM) scheme could be made to control such a valve. The main drawback of that approach consists in the limitation generally imposed by linear control systems. In fact, in embodiments like the gas-pulsing-based precursor delivery system, where the pulsing of the upstream valve 164 depends on the pulsing of the downstream valves 174 (i.e., opening together and closing together), the use of linear controllers poses a limit to the minimum achievable pressure rise-time. Pressure rise-time is defined as the time taken to reach a target pressure starting from an initial condition. In fact, it is known in the literature that bang-bang control strategies, non-linear in nature, are more suitable for applications where a fast rise-time is required. However, the disadvantage of using a bang-bang control strategy for a gas-pulsing-based precursor delivery system like that illustrated in FIG. 1 consists in the potential over-usage of the control valve 164. In fact, over-usage of the valve 164 would result in a decreased life-span of the valve itself.

Accordingly, one or more embodiments of the method 200 allow the reservoir pressure to achieve the fastest rise-time, while minimizing the usage of the upstream valve 164. In some embodiments, the method 200 comprises different types of control strategies, referred to as a first pressurizing configuration 203 and a second pressurizing configuration 205. The control strategy used at any given point of the overall gas delivery process, according to some embodiments, is based on the gas volume/flow needs and required performance at any given time. A control strategy selector 206 determines which control strategy is used at any given time. While the embodiment illustrated in FIG. 5 includes two control strategies (first pressurizing configuration 203 and second pressurizing configuration 205), the skilled artisan will recognize that more than two different control strategies can be employed for any process.

There are at least two different control strategies employed during a process in a processing chamber. The first control strategy is referred to as a first pressurizing configuration or a first pressurizing sequence. A first pressurizing configuration is one or more instruction sets configured to perform the first pressurizing sequence. The second control strategy is referred to as a second pressurizing configuration or a second pressurizing sequence. The second pressurizing configuration is one or more instruction set configured to perform the second pressurizing sequence.

In some embodiments, the first pressurizing configuration 203 (or first pressurizing sequence) operates as a traditional bang-bang control strategy. In some embodiments, the first pressurizing configuration 203 (or first pressurizing sequence) achieves a faster attainable pressure rise-time than the second pressurizing configuration 205 (or second pressurizing sequence), or any other control strategy in use. In some embodiments, the first pressurizing configuration 203 (or first pressurizing sequence) comprises opening the upstream valve 164 at the same time as all of the downstream valves 174. In some embodiments, the first pressurizing configuration 203 (or first pressurizing sequence) comprises opening the upstream valve 164 when some but less than all of the downstream valves 174 are open. In some embodiments, the first pressurizing configuration 203 (or first pressurizing sequence) comprises opening the upstream valve 164 while all of the downstream valves 174 are closed.

While the first pressurizing configuration 203 (or first pressurizing sequence) is employed to pressurize the reservoir 120, the learning process 204, which is a part of the control strategy selector 206, characterizes the pressure behavior within the reservoir 120 during use of the first pressurizing configuration 203 (or first pressurizing sequence). In some embodiments, the learning process 204 extrapolates parameter values for later use within the second pressurizing configuration 205 (or second pressurizing sequence).

At the moment in which the control strategy selector 206 enables the pressurizing configuration 205, the latter takes over the task of regulating the pressure 150 to the desired target 201. At that moment, an overreaction or underreaction of the pressurizing configuration 205 would lead to a pressure rise or drop, respectively, beyond the acceptable limits. To avoid this undesired event, the learning process 204 has the objective of determining the exact time of switching, and the initial reaction that the pressurizing configuration 205 has to provide at the moment that it is enabled. Therefore, at the proper moment when the switching occurs, the learning process 204 feeds to the pressurizing configuration 205 information about the amount of initial reaction to be provided in order to maintain the pressure 150 to the target 201. Such an information is a function of the switching time.

In some embodiments, during the learning process 204, each pulse of the downstream valves 174 allows substantially the same amount of gas to pass through. As used in this specification and the appended claims, the phrase "substantially the same amount of gas" means that the volume of gas for any given pulse is within ±15%, ±10% or ±5% of the average volume for the valve opening pulses.

The learning process 204 of some embodiments is configured to determine the parameters for the second pressurizing configuration 205 (or second pressurizing sequence) within a small number of bang-bang (open-close) cycles of the upstream valve 164. In some embodiments, the parameters for the second pressurizing configuration 205 are determined within 25 bang-bang (open-close) cycles, or within 20, 15, 10, 9, 8, 7, 6 or 5 bang-bang (open-close) cycles. Stated differently, in some embodiments, the parameters for the second pressurizing sequence are determined within 25, 20, 15, 10, 9, 8, 7, 6 or 5 open-close cycles of the upstream valve during the first pressurizing sequence.

In some embodiments, the number of cycles of the first pressurizing configuration 203 (or first pressurizing sequence) is user-determined. In some embodiments, the number of cycles of the first pressurizing configuration 203 (or first pressurizing sequence) is determined by the controller. Once the controller has established the PWM parameters, the control strategy selector 206 switches the pressurizing configuration to the second pressurizing configuration 205.

In some embodiments, the second pressurizing configuration 205 (or first pressurizing sequence) comprises a generic linear control system paired with a PWM functionality. Once the pressure within the reservoir 120 has reached the target value, and the key parameters are extrapolated by the learning process 204, the control strategy selector 206 switches from the first pressurizing configuration 203 (or first pressurizing sequence) to the second pressurizing configuration 205 (or second pressurizing sequence) to control of the upstream valve 164. In some embodiments, the second pressurizing configuration 205 maintains the reservoir 120 pressure around the target value while minimizing the usage of the upstream valve 164.

In some embodiments, the second pressurizing configuration 205 includes an event-based analysis. For example, in some embodiments, the open-close timing of the upstream valve 164 is at least partially based on the open-close timing of each of the downstream valves 174. In some embodiments, the second pressurizing configuration 205 opens the upstream valve 164 while all of the downstream valves 174 are closed.

In some embodiments, the downstream valves 174 open at different time intervals so that some downstream valves 174 are opened while some are closed. In embodiments of this sort, the upstream valve 164 can be opened when all of the downstream valves are closed, when some of the downstream valves are closed or when none of the downstream valves are closed. In some embodiments, there may not be a time during the process sequence in which all of the downstream valves are closed. In embodiments of this sort, the upstream valve is opened when the smallest number of downstream valves is open or when the largest number of downstream valves is open.

In some embodiments, the upstream valve 164 is cycled (one opening and closing) an average number of times per minute during the first pressurizing sequence. In some embodiments, the upstream valve 164 is cycled a smaller number of times per minute during the second pressurizing sequence than during the first pressurizing sequence. In some embodiments, during the second pressurizing sequence, the upstream valve 164 is cycled less than 95%, 90%, 85%, 80%, 75%, 70%, 65%, 60%, 55% or 50% of the number of times per minute than during the first pressurizing sequence. In some embodiments, the second pressurizing sequence comprises cycling the upstream valve less frequently than during the first pressurizing sequence.

The resulting overall method 200 of some embodiments is considered to be an objective-dependent control strategy paired with a learning algorithm. When the objective is to minimize the pressure rise time, the first pressurizing configuration 203 is used; when the objective is to maintain constant pressure while minimizing the usage of the upstream valve 164, the second pressurizing configuration 205 is utilized. The control strategy selector 206 of one or more embodiments switches between the various pressurizing configurations.

As illustrated in FIG. 1, the system controller 190 of some embodiments is coupled to one or more of the upstream valve 164, pressure gauge 150, and one or more downstream valves 174. The system controller 190 of some embodiments includes a processor, a memory coupled to the processor, input/output devices coupled to the processor, and support circuits to communication between the different electronic components.

The memory can include one or more of transitory memory (e.g., random access memory) and non-transitory memory (e.g., storage). The memory, or computer-readable medium, of the processor may be one or more of readily available memory such as random access memory (RAM), read-only memory (ROM), floppy disk, hard disk, or any other form of digital storage, local or remote. The memory of some embodiments retains an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform the method. The controller 190 of some embodiments is connected to and configured to operate intermediate components to perform the functions of the methods. For example, the controller of some embodiments is connected to and configured to control one or more of gas valves, pressure gauges, etc.

The controller 190 of some embodiments has one or more configurations selected from: a configuration to perform a first pressurizing sequence a first number of cycles; and/or a configuration to perform a second pressurizing sequence after the first number of cycles until the process in the processing chamber is completed. In some embodiments, the controller 190 includes a configuration to determined parameters for the second pressurizing sequence during the first pressurizing sequence.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of providing a flow of gas to a processing chamber, the method comprising:
    performing a first pressurizing sequence a first number of cycles, the first pressurizing sequence comprising opening and closing a valve upstream of a reservoir and opening and closing one or more valves downstream of the reservoir to pressurize the reservoir to a predetermined value; and
    performing a second pressurizing sequence after the first number of cycles until a process in the processing chamber is completed, the second pressurizing sequence comprising minimizing cycling of the upstream valve to maintain a pressure in the reservoir using parameters determined during the first pressurizing sequence,
    wherein the first pressurizing sequence and the second pressurizing sequence are performed by a system controller connected to the upstream valve, the one or more downstream valves and a pressure gauge connected to the reservoir,
    wherein parameters for the second pressurizing sequence are determined by the system controller during the first pressurizing sequence, and
    wherein the first pressurizing sequence comprises opening and closing the upstream valve and the one or more downstream valves at the same time.

2. The method of claim 1, wherein the first number of cycles is less than or equal to 20.

3. The method of claim 1, wherein the second pressurizing sequence comprises opening the upstream valve while all of the one or more downstream valves are closed.

4. The method of claim 1, wherein the second pressurizing sequence comprises cycling the upstream valve less frequently than during the first pressurizing sequence.

5. The method of claim 4, wherein the upstream valve is cycled less during the second pressurizing sequence than 75% of the number of cycles per minute that the upstream valve is cycled during the first pressurizing sequence.

6. The method of claim 4, wherein during the second pressurizing sequence, the upstream valve is cycled less than 65% of the number of cycles per minute that the upstream valve is cycled during the first pressurizing sequence.

7. The method of claim 1, wherein the second pressurizing sequence comprises opening the upstream valve while some of the downstream valves are closed.

8. The method of claim 1, wherein the first pressurizing sequence achieves a faster attainable pressure rise-time than the second pressurizing sequence.

9. The method of claim 1, wherein the system controller determines the time at which the method switches from the first pressurizing sequence to the second pressurizing sequence.

10. The method of claim 1, wherein during the first pressurizing sequence, each pulse of the downstream valves allows substantially the same amount of gas to pass through.

11. The method of claim 1, wherein the first number of cycles is user-determined.

12. The method of claim 1, wherein the parameters for the second pressurizing sequence comprise a pulse-width modulation scheme.

* * * * *